United States Patent [19]
Goldberg et al.

[11] Patent Number: 5,987,241
[45] Date of Patent: Nov. 16, 1999

[54] ROUTING TECHNIQUES TO ASSURE ELECTRICAL INTEGRITY IN DATAPATH BLOCKS

[75] Inventors: David N. Goldberg; Richard M. McClosky, both of San Jose; Nicholas S. Fiduccia, Saratoga; Scott M. Dziak, San Jose, all of Calif.

[73] Assignee: Hewlett-Packard Company, Palo Alto, Calif.

[21] Appl. No.: 08/775,426

[22] Filed: Jan. 9, 1997

[51] Int. Cl.$^6$ .................................................. G06F 17/50
[52] U.S. Cl. .................................. 395/500.15; 395/500.11
[58] Field of Search .................................... 364/488, 489, 364/490, 491; 395/500.15, 500.13, 500.09, 500.11, 500.03

[56] References Cited

U.S. PATENT DOCUMENTS

| | | | |
|---|---|---|---|
| 4,593,362 | 6/1986 | Bergeron et al. | 364/488 |
| 5,369,596 | 11/1994 | Tokumaru | 364/491 |
| 5,508,938 | 4/1996 | Wheeler | 364/488 |
| 5,666,290 | 9/1997 | Li et al. | 364/491 |
| 5,724,248 | 3/1998 | Ehlig | 364/488 |
| 5,847,969 | 12/1998 | Miller et al. | 364/491 |

*Primary Examiner*—Eric W. Stamber
*Assistant Examiner*—Leigh Marie Garbowski

[57] ABSTRACT

Connection lines are routed within an integrated circuit. A first set of the connection lines are pre-routed. The first set of connection lines carry signals which have a higher likelihood of being influenced by crosstalk. The first set of connection lines are routed to tracks where minimal capacitive coupling will result. For example, this may be in a track immediately adjacent to a power line or a ground line. Alternatively, or in addition, this may be in a track between two empty tracks. After the first set of connection lines have been routed, a second set of connection lines are routed. The second set of connection lines carry signals which have a lower likelihood of being influenced by crosstalk. The second connection lines are routed to tracks which are not utilized by the first set of connection lines.

20 Claims, 4 Drawing Sheets

ROUTING TECHNIQUES TO ASSURE ELECTRICAL INTEGRITY IN DATAPATH BLOCKS

BACKGROUND

The present invention concerns the design and manufacture of very large scale integrated (VLSI) circuits and pertains particularly to improved routing within a datapath block within an integrated circuits.

When designing integrated circuits, logic blocks are located on the integrated circuit. Conductive lines are routed between and within logic blocks. Datapath blocks, such as register stacks, pose some challenging electrical and routing issues for designers. These regular structures often have signals and/or busses which span long distances. The need for density often dictates that signal-to-signal spacing be minimal. Typically, datapath blocks have a series of tracks which are used for routing data signals. These tracks are often designed to have a minimal width with minimal space between the tracks. While this results in conserving the space on the integrated circuit utilized to implement datapath blocks, there is also a certain amount of capacitive coupling which can occur between the lines. For tracks where the width of tracks and the spacing between tracks are each in the range of 1.2 microns, the capacitive coupling between a metal line in one track and metal lines in adjoining tracks can be as high as 60%. The resulting coupling noise (also referred to as crosstalk) can result in corruption of data stored within registers.

SUMMARY OF THE INVENTION

In accordance with the preferred embodiment of the present invention, connection lines are routed within an integrated circuit. A first set of the connection lines are pre-routed. The first set of connection lines carry signals which have a higher likelihood of being influenced by crosstalk. The first set of connection lines are pre-routed to tracks where minimal capacitive coupling will result. For example, this may be in a track immediately adjacent to a power line or a ground line. Alternatively, or in addition this may be in a track next to an empty track or between two empty tracks. After the first set of connection lines have been routed, a second set of connection lines are routed. The second set of connection lines carry signals which have a lower likelihood of being influenced by crosstalk. The second connection lines are routed to tracks which are not utilized by the first set of connection lines.

For example, in a preferred embodiment of the present invention, the connection lines are routed within a datapath block. The first set of connection lines are, for example, global lines which provide input from outside the datapath block.

In one embodiment of the present invention, additional power lines and/or ground lines may be added to a channel in order to provide more opportunity to shield connection lines. Additionally, the signals which have a higher likelihood of being influenced by crosstalk can be buffered to prevent corruption in the storage of data.

The present invention provides for an efficient and effective way to protect weak signals against corruption due to crosstalk.

DESCRIPTION OF THE PREFERRED EMBODIMENT

Figure 1:
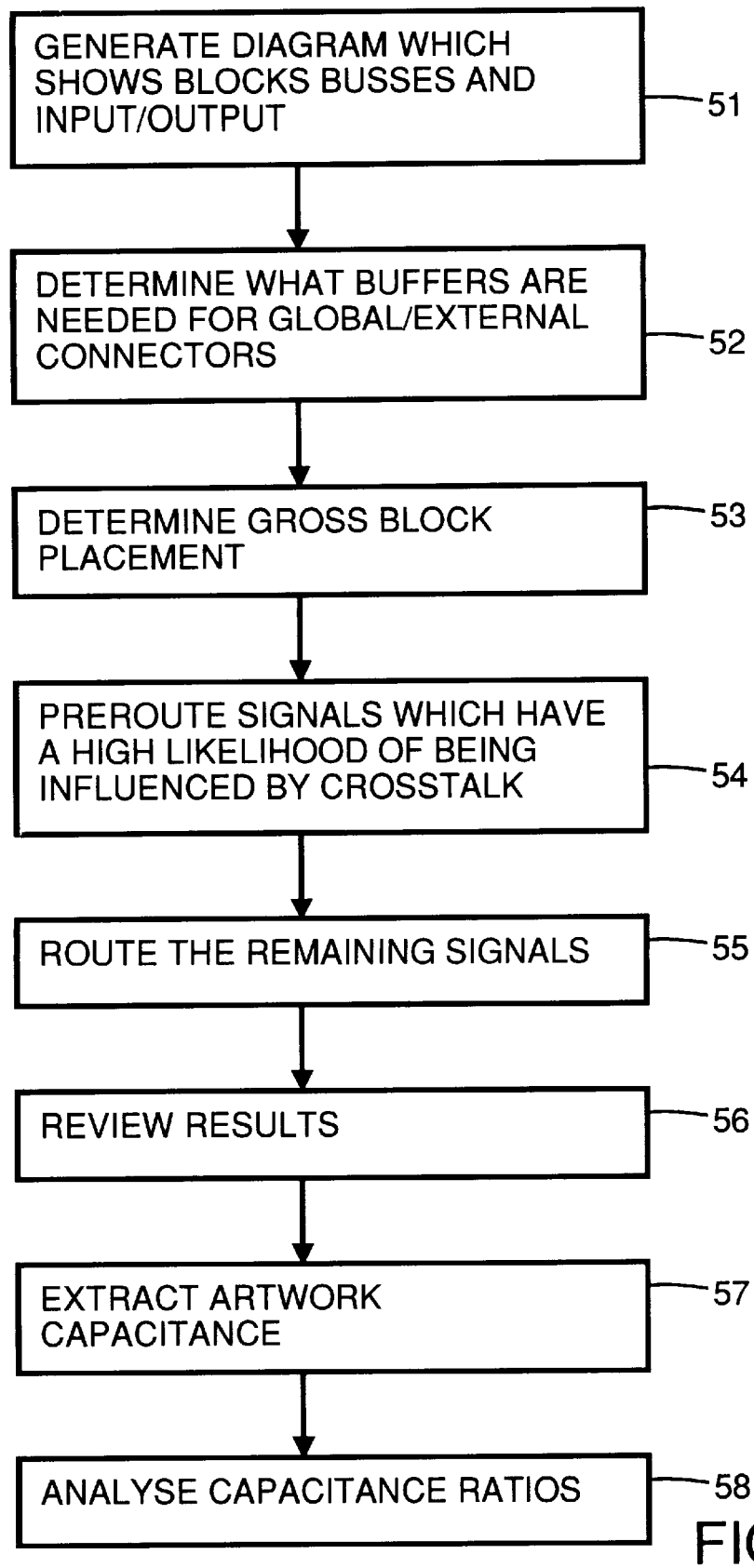
FIG. 1 shows a flowchart which summarizes a method for performing routing within a datapath block in accordance with a preferred embodiment of the present invention.

FIG. 1 is a flowchart which summarizes a method for performing routing within a datapath block in accordance with a preferred embodiment of the present invention. In a step 51, a "stick figure" of the datapath block. The stick figure is a diagram which shows the logic blocks within the datapath as well as buses connected to the logic blocks and input/output to the datapath block.

Figure 2:
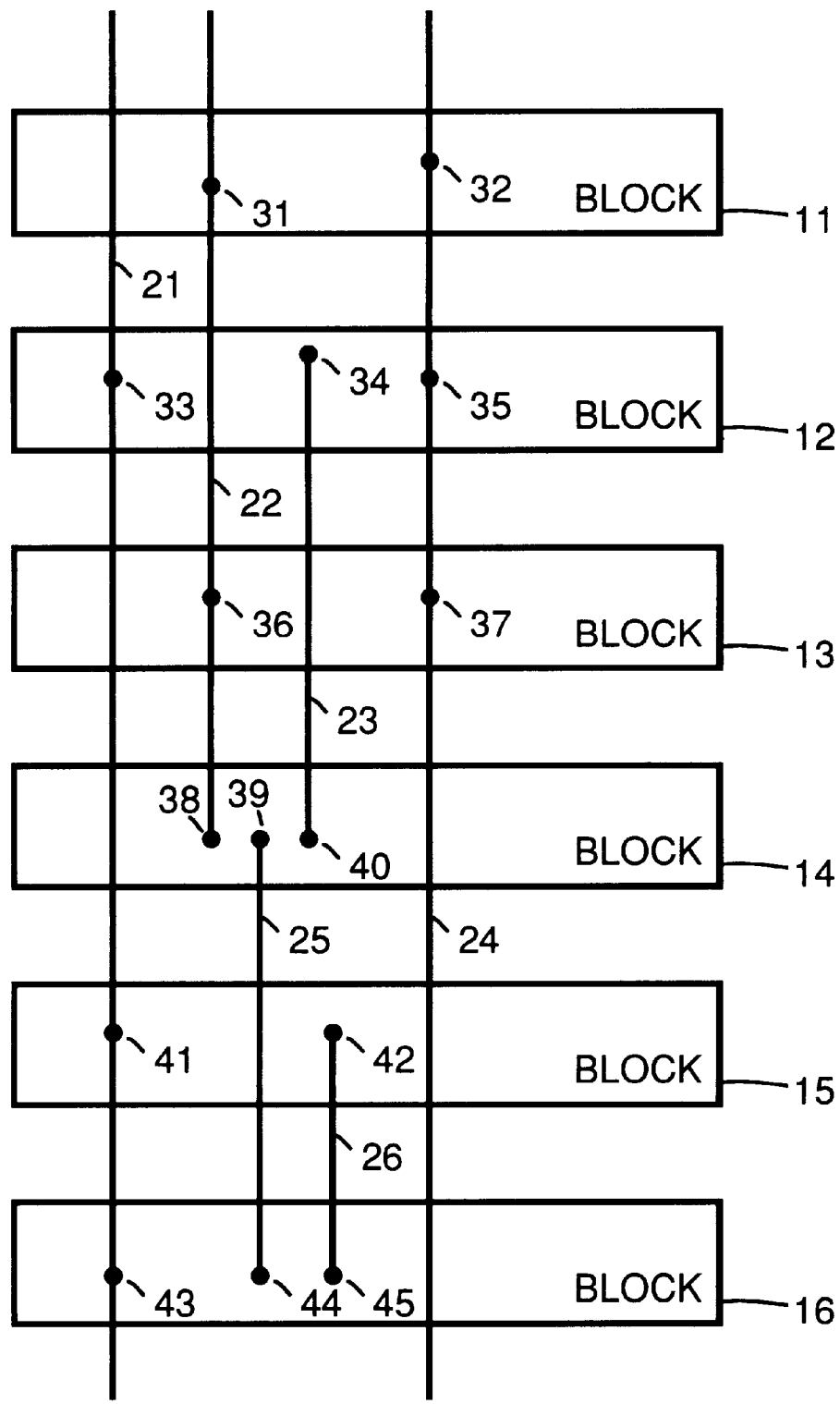
FIG. 2 shows a logic block diagram or "stick figure" of a datapath block in accordance with the prior art.

A simplified example of a stick figure is shown in FIG. 2. The stick figure includes a block 11, a block 12, a block 13, a block 14, a block 15 and a block 16. Each of blocks 11 through 16 provide some logic functionality for the datapath block. For example, one or more of the blocks implement a register. The other blocks perform other logic functions such as shifting data, adding bits, and so on. A global bus 21, a global bus 22 and a global bus 24 each provide input/output to the datapath block described by the stick figure. A local bus 23, a local bus 25, and a local bus 26 provide interconnection between blocks. As is shown in FIG. 2, global bus 21 is connected to block 12 by a connection 33, to block 15 by a connection 41, and to block 16 by a connection 43. Global bus 22 is connected to block 11 by a connection 31, to block 13 by a connection 36, and to block 14 by a connection 8. Local bus 23 is connected to block 12 by a connection 34, and to block 14 by a connection 40. Global bus 24 is connected to block 11 by a connection 33, to block 12 by a connection 35, and to block 13 by a connection 37. Local bus 25 is connected to block 14 by a connection 39, and to block 16 by a connection 44. Local bus 26 is connected to block 15 by a connection 42, and to block 26 by a connection 44.

In a step 52, shown in FIG. 1, a determination is made as to what buffers are needed for global/external connectors. In the present invention, top-level input signals are buffered when they feed known threshold voltage sensitive circuits. For example, buffering is used for a register cell in the datapath block which uses a pass transistor to receive the register input data. Inputs to the register which spike below ground by a voltage greater than MOS threshold voltage (Vt) may cause the data contained by the register to be inadvertently modified. Signals on global busses (also referred to as top-level signals) are more susceptible to large noise spikes, therefore, in the preferred embodiment, these signals are buffered. The buffering prevents any noise spike on incoming data signals from corrupting the register value. Signals on local buses within the data path busses are less susceptible to crosstalk. This is largely because the local busses are of relatively short distance and so signals on the local busses remain relatively strong. Additionally global busses that are both input and output can be re-architected to separate them into two separate busses.

Figure 3:
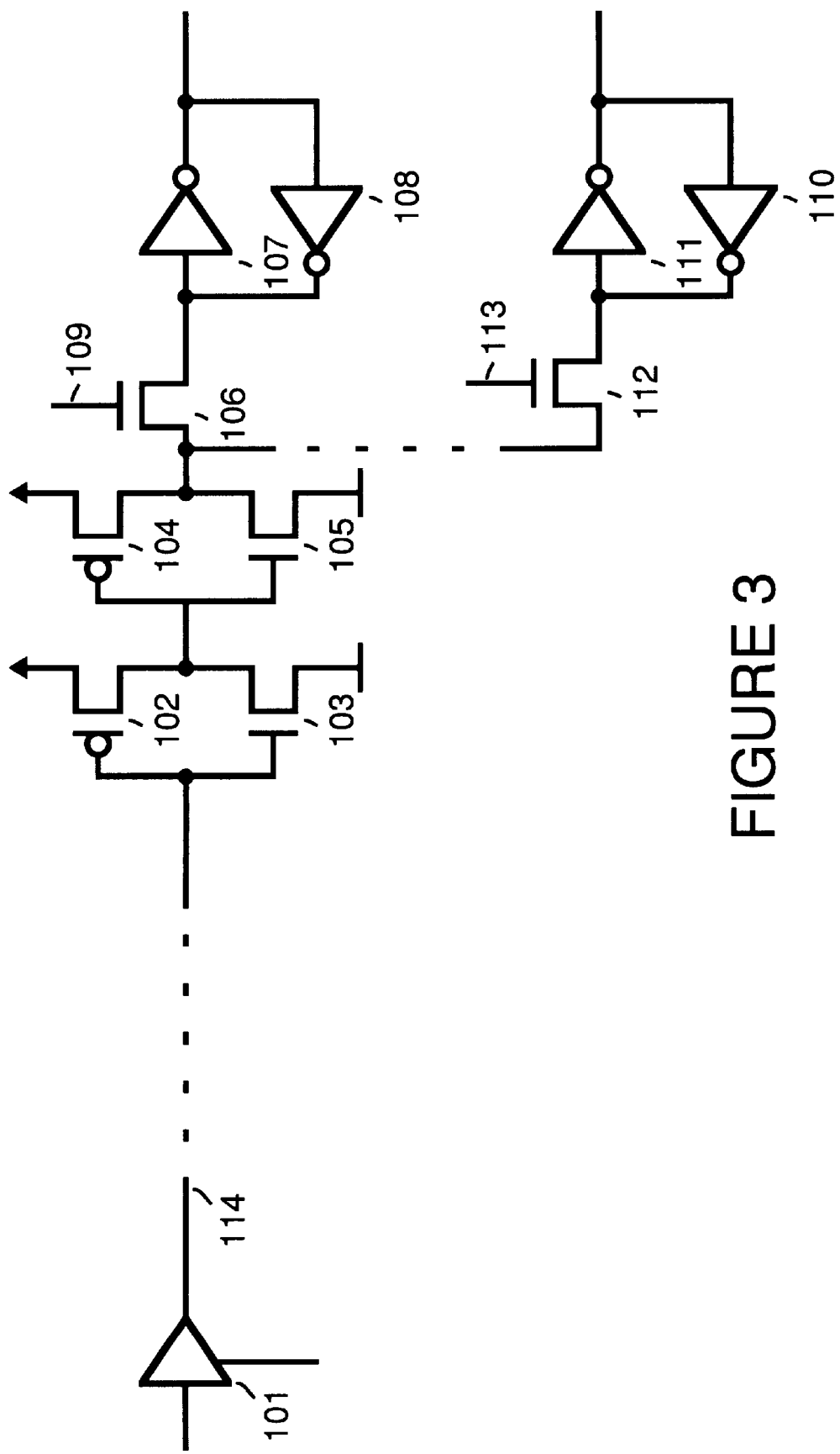
FIG. 3 illustrates use of a buffer for incoming lines from a global bus in accordance with a preferred embodiment of the present invention.

FIG. 3 illustrates use of a buffer for incoming lines from a global bus in accordance with a preferred embodiment of the present invention. A signal on a global bus line 114 is generated by a tri-state driver 101. The signal on global bus line 114 serves as input to a latch shown in FIG. 3 to consist of a transistor 106, logic gate 107 and a logic gate 108. A register load-control signal 109 is used to control transistor 106 loading the latch. Additionally, the signal on global bus line 114 may serve as input to other latches. This is illustrated in FIG. 3 by a latch which consists of a transistor 112, a logic gate 110 and a logic gate 111. A register load-control signal 113 is used to control transistor 112.

If the input to any of the latches shown in FIG. 3 undershoots (e.g., because of crosstalk) when the load-control signal for the latch is at 0 volts, the transistor for the latch may turn on (erroneously) and destroy the latch value. In order to remedy this, a buffer is added to the input of the latches. The buffer shown in FIG. 3 consists of two logic NOT gates—a transistor pair 102, 103 and a transistor pair 104, 105—connected in series. When the signal on global bus line 114 undershoots, the buffer prevents the values held by the latches from being corrupted.

In a step 53, shown in FIG. 1, gross block placement is determined for the datapath block. In this step, the locations for each of blocks 11 through 16 (shown in FIG. 2) are determined.

In a step 54, signals which have a high likelihood of being influenced by crosstalk are pre-routed. For example, signals on global lines, particularly those generated by tri-state drivers, are susceptible to crosstalk. These are pre-routed to be placed near a power (VDD) line or a ground (GND) line and/or to be next to an empty track. In this way, the crosstalk effect is reduced for these lines. Signals which are strongly driven, and/or travel a shorter distance generally are not as significantly affected by crosstalk. These can be later routed in the remaining tracks.

As an added help in elimination of crosstalk, additional power (VDD) and ground (GND) wires may be added in extra tracks. This allows for the shielding of additional lines which may be affected by crosstalk.

In a step 55, the connection lines for the remaining signals are routed. This may be done, for example, using a standard routing tool.

Figure 4:
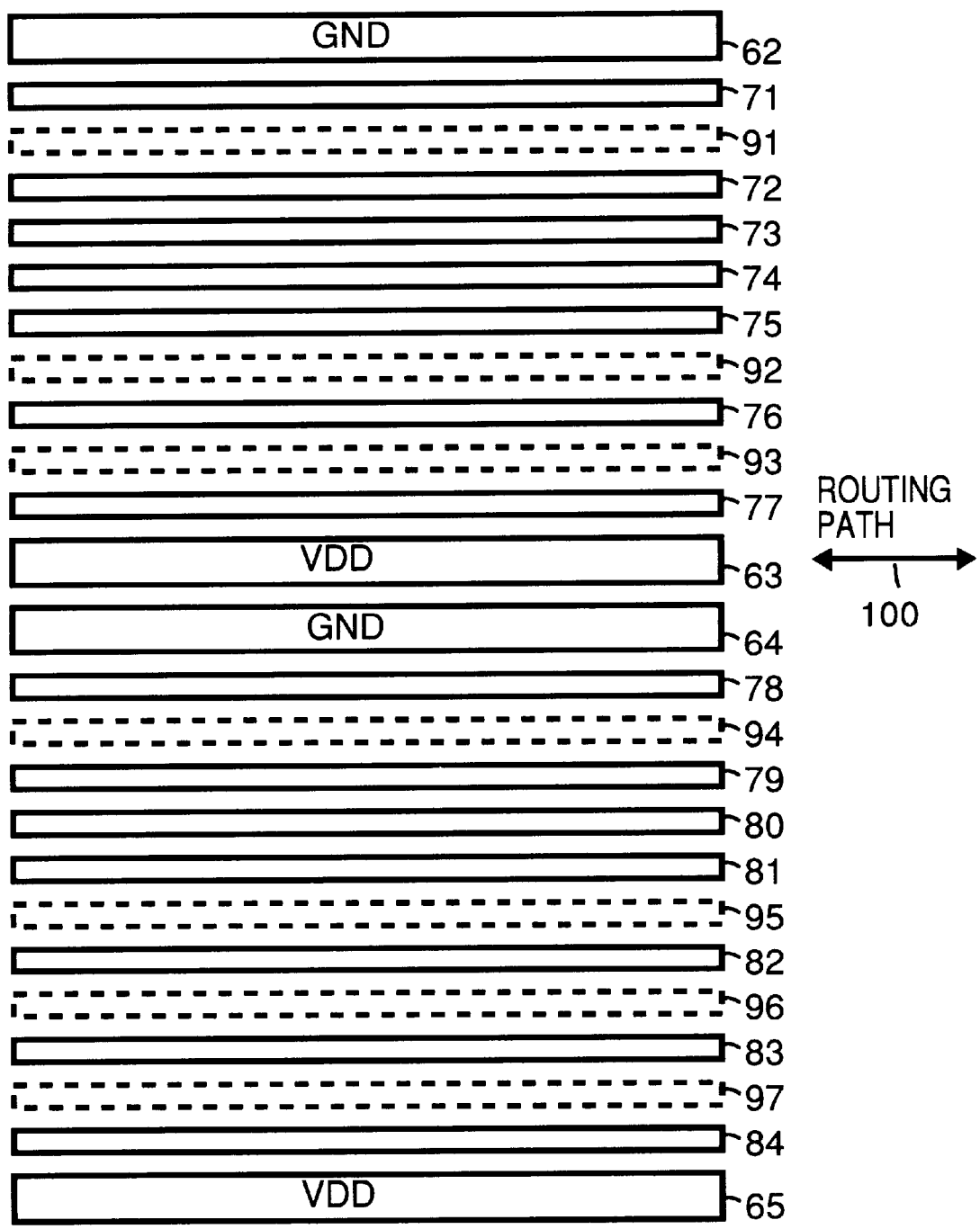
FIG. 4 illustrates routing of conductive lines within a datapath block in accordance with a preferred embodiment of the present invention.

FIG. 4 illustrates routing of conductive lines within a datapath block in accordance with a preferred embodiment of the present invention. Conductive lines are routed along a routing path 100. Multiple ground lines and power lines are shown allowing for more opportunity for the shielding of "weak" or tri-state signals. Specifically, FIG. 4 shows a ground (GND) line 62, a power line (VDD), 63, a ground line 64 and a ground line 65. In addition, connection lines used for data signals are also shown. Specifically, FIG. 4 shows a connection line 71, a connection line 72, a connection line 73, a connection line 74, a connection line 75, a connection line 76, a connection line 77, a connection line 78, a connection line 79, a connection line 80, a connection line 81, a connection line 82, a connection line 83 and a connection line 84. Interspersed among connection lines 71 through 84 are various empty tracks. For example, shown in FIG. 4 are an empty track 91, an empty track 92, an empty track 93, an empty track 94, an empty track 95, an empty track 96 and an empty track 97.

When some of connection lines 71 through 84 are pre-routed, those of connection lines 71 through 84 which have a high likelihood of being influenced by crosstalk are pre-routed to be placed near a power (VDD) line or a ground (GND) line and/or to be next to an empty track. For example, in FIG. 4, connection line 71 is next to ground line 62 on one side and empty track 91 on the other side. Connection line 76 is next to empty track 92 on one side and empty track 93 on the other side. Connection line 77 is next to empty track 93 on tone side and next to power line 63 on the other side. Connection line 78 is next to ground line 64 on one side and empty track 94 on the other side. Connection line 82 is next to empty track 95 on one side and empty track 96 on the other side. Connection line 83 is next to empty track 96 on one side and empty track 97 on the other side. Connection line 84 is next to empty track 97 on one side and next to power line 65 on the other side. Connection lines 71, 76, 77, 78, 82, 83 and 84 are all well placed for signals which have a high likelihood of being influenced by crosstalk.

Connection lines 73, 74, and 80 are surrounded by other connection lines. These are connection lines which are the most likely to be affected by crosstalk. Therefore, connection lines 73, 74, and 80 are in these locations because the signals on connection lines 73, 74, and 80 are strong signals which are the least likely to be influenced by crosstalk.

In a step 56 (shown in FIG. 1), the designer reviews the results of the design. In a step, 57, the artwork capacitance of the connection lines in the datapath block are extracted. In a step 58, the capacitance ratios are analyzed. In general, it is desirable that connection lines which have a high likelihood of being influenced by crosstalk have a ratio of line-to-line capacitance to total signal capacitance (also referred to as the total coupling factor) which is under 25%. If the capacitance ratios are not acceptable, the designer returns to step 54 to re-route connection lines which have an unacceptable ratio of line-to-line capacitance to total signal capacitance.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for routing connection lines within a plurality of tracks, all the tracks within the plurality of tracks being located within a single plane of an integrated circuit, the method comprising the following steps:

(a) routing first connection lines which carry signals which have a higher likelihood of being influenced by crosstalk, the first connection lines being routed to tracks from the plurality of tracks where minimal capacitive coupling will result; and, (b) routing second connection lines which carry signals which have a lower likelihood of being influenced by crosstalk, the second connection lines being routed to tracks from the plurality of tracks not utilized in step (a).

2. A method as in claim 1 wherein in step (a) at least one of the first connection lines is routed in a track immediately adjacent to a power line for the integrated circuit.

3. A method as in claim 2 wherein step (a) includes placing a plurality of power lines within a routing channel to allow for shielding of a greater number of connection lines.

4. A method as in claim 1 wherein in step (a) at least one of the first connection lines is routed in a track immediately adjacent to a ground line for the integrated circuit.

5. A method as in claim 4 wherein step (a) includes placing a plurality of ground lines within a routing channel to allow for shielding of a greater number of connection lines.

6. A method as in claim 1 wherein in step (a) at least one of the first connection lines is routed between tracks which are left empty.

7. A method as in claim 1 wherein step (a) includes buffering the signals which have a higher likelihood of being influenced by crosstalk.

8. A method as in claim 1 wherein step (a) is performed as pre-routing by a designer of the integrated circuit.

9. A method as in claim 1 wherein the first connection lines and the second connection lines are within a datapath block and wherein in step (a) the first connection lines comprise global lines which provide input from outside the datapath block.

10. A datapath block within an integrated circuit comprising:

logic blocks which perform logic functions;

first connection lines, coupled to the logic blocks, the first connection lines carrying signals which originate from outside the datapath block; and, second connection lines, coupled to the logic blocks, the second connection lines carrying signals which originate from inside the datapath block;

wherein, the first connection lines are routed in tracks where minimal capacitive coupling will result, the tracks where minimal capacitive coupling will result including a first track immediately adjacent to a ground line for the integrated circuit and a second track immediately adjacent to a power line for the integrated circuit; and, wherein the first connection lines and the second connection lines are all routed in tracks which are within a single plane of the integrated circuit.

11. A datapath block as in claim 10 wherein the tracks where minimal capacitive coupling will result include a third track between two tracks which are left empty.

12. A datapath block as in claim 10 wherein the first connection lines are buffered.

13. A method for designing a major block within an integrated circuit comprising the following steps:

(a) providing a stick figure for the major block;

(b) determining gross block placement for logic blocks within the major block; and, (c) routing connection lines for the major block, including the following substeps:

(c.1) routing first connection lines which carry signals which have a higher likelihood of being influenced by crosstalk, the first connection lines being routed to tracks where minimal capacitive coupling will result, and (c.2) routing second connection lines which carry signals which have a lower likelihood of being influenced by crosstalk, the second connection lines being routed to tracks not utilized in substep (c.1);

wherein in step (c) the first connection lines and the second connection lines are all routed in tracks which are within a single plane of the integrated circuit.

14. A method as in claim 13 wherein in substep (c.1) at least one of the first connection lines is routed in a track immediately adjacent to a power line for the integrated circuit.

15. A method as in claim 14 wherein substep (c.1) includes placing a plurality of power lines within a routing channel to allow for shielding of a greater number of connection lines.

16. A method as in claim 13 wherein in substep (c.1) at least one of the first connection lines is routed in a track immediately adjacent to a ground line for the integrated circuit.

17. A method as in claim 16 wherein substep (c.1) includes placing a plurality of ground lines within a routing channel to allow for shielding of a greater number of connection lines.

18. A method as in claim 13 wherein in substep (c.1) at least one of the first connection lines is routed between tracks which are left empty.

19. A method as in claim 13 additionally including the following step:

buffering the signals which have a higher likelihood of being influenced by crosstalk.

20. A method as in claim 13 wherein the major block is a datapath block and wherein in substep (c.1) the first connection lines comprise global lines which provide input from outside the datapath block.

* * * * *